United States Patent [19]

Ho et al.

[11] Patent Number: 5,565,849
[45] Date of Patent: Oct. 15, 1996

[54] SELF-BIASED MAGNETOSTRICTIVE ELEMENT FOR MAGNETOMECHANICAL ELECTRONIC ARTICLE SURVEILLANCE SYSTEMS

[75] Inventors: Wing Ho, Boynton Beach; Nen-chin Liu, Parkland, both of Fla.; Robert O'Handley, Andover, Mass.

[73] Assignee: Sensormatic Electronics Corporation, Deerfield Beach, Fla.

[21] Appl. No.: 392,070

[22] Filed: Feb. 22, 1995

[51] Int. Cl.$^6$ ............................................. G08B 13/14
[52] U.S. Cl. ............................................. 340/572; 148/108
[58] Field of Search ........................... 340/572, 551; 148/108

[56] References Cited

U.S. PATENT DOCUMENTS 4,158,434  6/1979  Peterson ........................ 340/572 X
4,473,415  9/1984  Ochiai et al. ........................ 148/108
4,510,489  4/1985  Anderson, III et al. ................ 340/572

*Primary Examiner*—Thomas Mullen
*Attorney, Agent, or Firm*—Robin, Blecker, Daley & Driscoll

[57] ABSTRACT

A self-biasing magnetostrictive element for a magnetomechanical EAS marker is formed by first annealing a ribbon of ferromagnetic material in the presence of a magnetic field applied in a transverse direction relative to the ribbon's longitudinal axis, and then annealing the ribbon a second time in the presence of a magnetic field applied in the direction of the longitudinal axis. The twice-annealed ribbon exhibits remanent magnetization along the longitudinal axis and has plural magnetic domains situated along the longitudinal axis. The orientation of magnetization in each domain is canted by $\pm\theta°<90°$ from the ribbon axis with the direction of canting alternating from domain to domain.

20 Claims, 10 Drawing Sheets

——— Pure rotation model $d = 3\lambda_s H/H_A^2$

- - - - Actual mixed magnetization process $\Omega_0$ = Coupled magneto-elastic resonance freq.

$\omega_0 = (\pi/\ell)(E_M/\rho)^{1/2}$ $\ell$ = length, $E_M$ = Young's mod
$\rho$ = mass density $\omega_0$ = Bare elastic resonance freq.

5,565,849

SELF-BIASED MAGNETOSTRICTIVE ELEMENT FOR MAGNETOMECHANICAL ELECTRONIC ARTICLE SURVEILLANCE SYSTEMS

BACKGROUND OF THE INVENTION

This invention relates to markers for use in electronic article surveillance systems and, in particular, to magnetic markers of the type which comprise magnetostrictive materials.

U.S. Pat. Nos. 4,510,489 and 4,510,490, both issued Apr. 9, 1985, describe a magnetomechanical tag formed from a magnetostrictive ferromagnetic element or strip. Disposed adjacent to the magnetostrictive element is a further element comprised of a hard magnetic material, such as Vicalloy or Arnokrome, which acts as a biasing mechanism. Arming or activating the magnetostrictive element is accomplished by magnetization of the ferromagnetic biasing element, thereby causing a DC magnetic field to be placed along the magnetostrictive element.

As described in the '489 patent, when the magnetostrictive element is biased by the DC magnetic field, subsequent application of an AC magnetic field to the magnetostrictive element causes the element to store energy mechanically and magnetically, via magnetostriction or magnetomechanical coupling. This energy is alternately stored and released at the frequency of the applied AC field.

Furthermore, the storage and release of such magnetomechanical energy is maximized at the material's magnetomechanical resonance and minimal at its anti-resonance and results in a detectable magnetic signal being generated by the magnetostrictive element. The strength of the generated magnetic signal depends upon the magnetomechanical coupling factor of the element. The latter factor, in turn, depends upon a number of criteria including the level of the DC bias field, the level of internal stress present in the element and the level and direction of any magnetic anisotropy in the element.

The '489 patent teaches that the coupling factor can be enhanced by creating or inducing a magnetic anisotropy in the magnetostrictive element in a direction transverse to its length. The direction of the induced anisotropy defines a so-called "easy axis" for the element. The '489 patent discloses that one way of establishing the induced anisotropy is by annealing the element in the presence of a magnetic field. The latter field magnetically saturates the element and is applied in a direction perpendicular to the length of the element. The '489 patent also teaches that the induced anisotropy can be established during formation of the element by casting.

As above-noted, the magnetostrictive element of the '489 marker is biased with a DC bias field via the field from the adjacent ferromagnetic element. Typically, the strength of the DC bias field is selected so as to cause the magnetostrictive element to operate near the so-called "knee" of its M-H curve. The '489 patent also proposes that the D.C. bias field can be provided by remanent flux in the magnetostrictive element but there is no disclosure as to how this can be accomplished.

The marker of the 489 patent has several advantages over other magnetic markers in terms of uniqueness and large signal to noise ratio. However, since the marker of '489 patent uses a magnetic biasing element, this complicates the mechanical design and adds cost to the marker structure. In addition, remote deactivation of the marker using a magnetic field requires a large threshold field (typically 150 Oe) and, therefore, high power. As a result, remote deactivation has generally not been used and deactivation has been limited to contact deactivation by a multipole magnet or bulk deactivation in a small volume of about 1 cu. ft.

Also, in the marker of the '489 patent, an attractive force exists between the magnetostrictive element and the ferromagnetic biasing element. This force results in a mechanical damping of the magnetostrictive element which is undesirable. Additionally, the geometry of the biasing element results in the generation of a non-uniform biasing field.

It is therefore a primary object of the present invention to provide a magnetomechanical marker which avoids the need to use a separate biasing element.

It is a further object of the invention to provide a magnetomechanical marker which can be more easily remotely deactivated.

SUMMARY OF THE INVENTION

In accordance with the principles of the present invention, the above and other objectives are realized in a marker comprised of a magnetostrictive element having length and width extent and having a plurality of magnetic domains along its length. These magnetic domains have magnetic anisotropies or easy axes which are of such a nature and whose directions are such that, with no external field applied to the magnetomechanical elements, there is a resultant magnetization of the magnetostrictive element along its length. This resultant magnetization acts as a DC bias field for the marker and no external bias need be provided.

In the embodiment of the invention to be disclosed hereinafter, the direction of the easy axis of each domain is at a angle relative to the length of the magnetostrictive element. Preferably, this angle is substantially the same, but alternates in direction from domain to domain.

In a further aspect of the invention, the domains of the magnetostrictive element are established by first annealing the magnetostrictive element in the presence of a saturating magnetic field applied transverse to the length of the element. The element is then annealed a second time in the presence of a further field applied along the length of the element. This results in domains whose easy axes or induced anisotropies alternate between $\pm\theta$ along and relative to the element length.

BRIEF DESCRIPTION OF THE DRAWINGS

The above and other features and aspects of the present invention will become more apparent upon reading the following detailed description in conjunction with the accompanying drawings in which.

DETAILED DESCRIPTION

Figure 1:
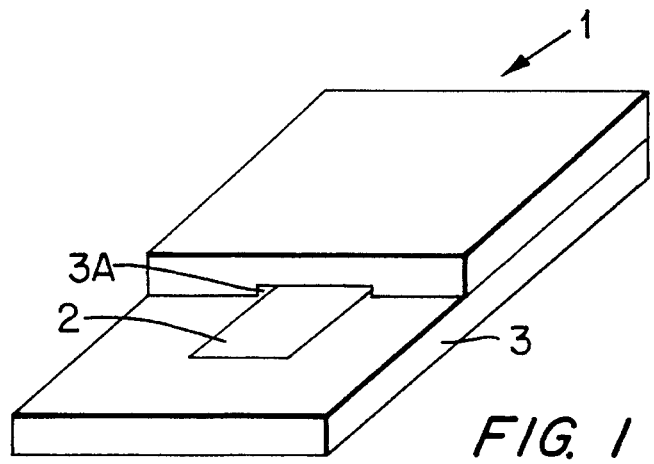
FIG. 1 shows a marker incorporating a magnetostrictive element in accordance with the principles of the present invention.

In FIG. 1, a marker 1 in accordance with the principles of the present invention is shown. The marker 1 comprises a magnetostrictive ferromagnetic element 2 contained within a cavity 3A of a plastic housing 3. The element 2 can be formed from any of the materials described in the above-mentioned '489 patent, the teachings of which are incorporated herein by reference.

The theory of operation of magnetostrictive elements, in general, and the magnetomechanical elements of the invention will now be discussed. When magnetomechanical coupling is absent, a magnetomechanical element has a "bare" mechanical resonance given by the dispersion relation $\omega_o=kv$ where $k=2\Pi/\lambda$ and $v=(E/\rho_m)^{1/2}$. Thus $\omega_o/2\Pi=v_o=(1/\lambda)(E/\rho_m)^{1/2}$ where $\lambda$ is the wavelength (twice the length of a ribbon for the fundamental longitudinal mode), E is Young's modulus and $\rho_m$ is the mass density.

Figure 7A:
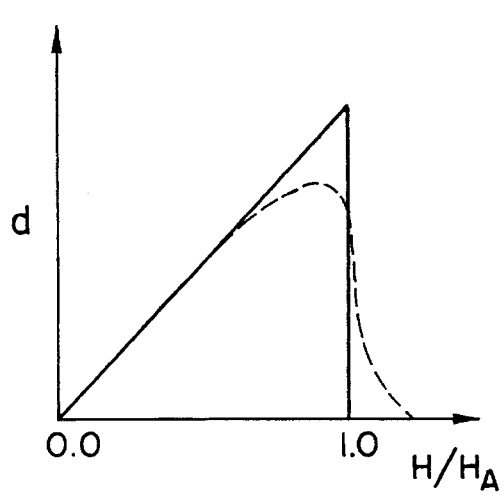
FIG. 7A is a graph illustrating the ideal and the realistic variation of the magnetostrictivity (d) as a function of the bias field.
Figure 7B:
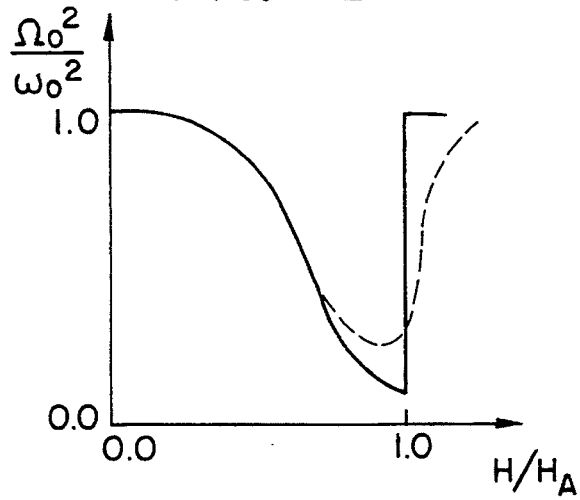
FIG. 7B is a graph illustrating the ideal and the realistic variation of the magnetomechanical resonance frequency as a function of the bias field.

When magnetomechanical coupling exists, the magnetic system of the magnetostrictive element resonates with the elastic wave and the frequency of the coupled mode is depressed below $\omega_o$. FIG. 7A shows for a transversely annealed ($\theta_o=0°$) magnetostrictive element, the magnetostrictivity $d=\partial\epsilon/\partial H)_\sigma=\partial B/\partial\sigma)_H=b\lambda_s H/H^2_A$ as a function of the normalized bias field $H/H_A$. FIG. 7B shows a relationship between the magnetomechanical resonance frequency $\Omega_o$ and the normalized bias field $H/H_A$. In FIGS. 7A and 7B the solid-line curves represent calculated values based on the theory presented by Mermelstein [IEEE trans. MAG-22, 442 (1986)], and the dashed-line curves represent experimentally measured values.

Figure 5A:
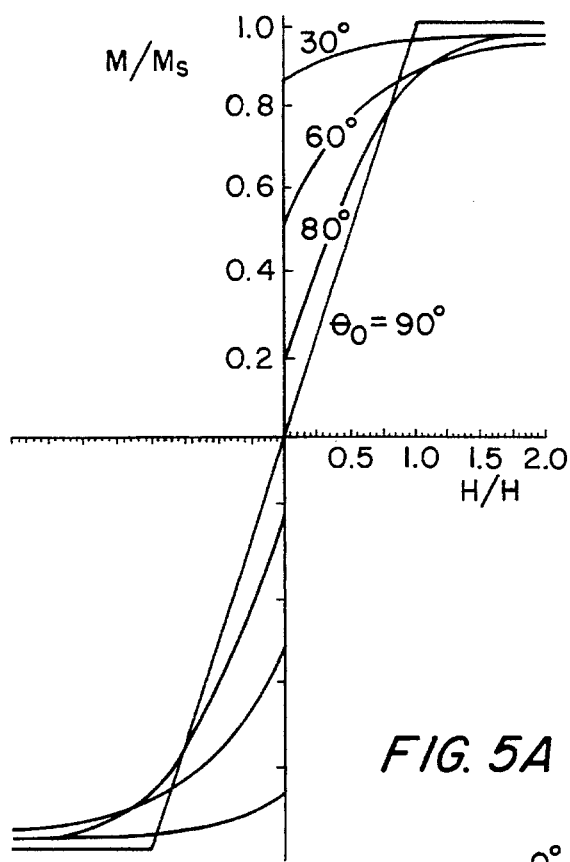
FIG. 5A is a graph illustrating magnetization as a function of applied field for uniaxial anisotropy oriented at various values of $\theta_o$ relative to applied field direction for reversible rotation.
Figure 5B:
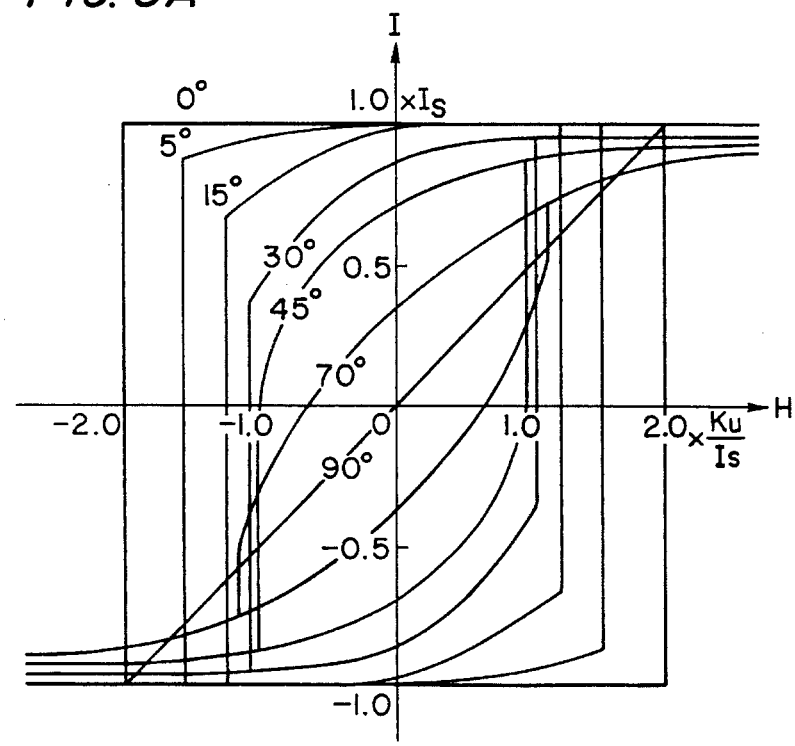
FIG. 5B is a graph illustrating magnetization as a function of applied field for uniaxial anisotropy oriented at various values of $\theta_o$ relative to applied field direction for irreversible rotation.

It is known that when the uniaxial anisotropy axis of a magnetostrictive element is at some arbitrary angle $\theta_o$ to the measurement field, a variety of M-H loops can be obtained that are intermediate to the linear M-H response at $\theta_o=90°$ and the square M-H response $\theta_0=0°$. The details of the shape depend on whether the rotation process is shorted by easy domain wall motion (i.e. $H_c=H_{coercivity}=0$) as is demonstrated by the curves in FIG. 5A or is dominated by pure magnetization rotation with no wall motion ($H_c$ not=0) as demonstrated by the curves of the element 2 of the invention shown in FIG. 5B. As indicated above, the curves of FIG. 5B show that a non-zero remanence can be achieved for a magnetostrictive element having irreversible rotation when $0°\leq\theta_o <90°$, which is the case for the element 2 of the present invention whose non-zero remanence condition and rotation process ($\theta_o>0°$) (which is necessary for coupling magnetic and elastic modes) result in a self-biased magnetic marker 1.

In accordance with the principles of the present invention, the magnetostrictive element 2 is adapted such that it has length L and width W extent and such that along its length the element has a plurality of magnetic domains whose magnetic anisotropies or easy axes are of such a nature and are directed in such directions as to create or establish a resultant magnetic field along the element in the absence of an applied magnetic field. As a result, the element 2 exhibits its own bias field and the marker 1 does not require an additional hard ferromagnetic element for this purpose.

FIG. 2 shows pictorially the magnetostrictive element 2 during its initial processing in accordance with the invention. As seen in FIG. 2A, an external saturating D.C. magnetic field $H_{ext}$ is applied across the element 2 in the presence of heat to anneal the material transverse to its length. The result of this anneal is to create a preferred direction of magnetization transvere to the ribbon axis. Note that the effect of the field anneal anisotropy is to favor magnetization in either direction across the ribbon axis.

Figure 2A:
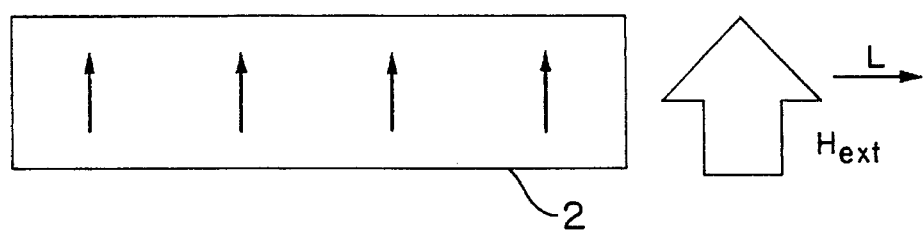
FIG. 2A illustrates, in simplified form, the magnetic domain structure of a transversely annealed magnetostrictive element in a saturating transverse field.
Figure 2B:
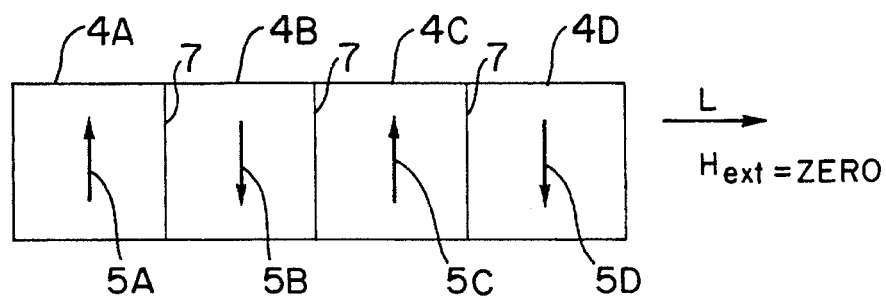
FIG. 2B illustrates, in simplified form, the magnetic domain structure of a demagnetized, transversely annealed magnetostrictive element.

Upon completion of transverse annealing the magnetostrictive element spontaneously demagnetizes itself when the external field $H_{ext}=0$, B=0 approximately, resulting in a condition shown in FIG. 2B. When demagnetized, the element 2 comprises a series of oppositely magnetized domains pictorially shown as 4A–4D, running across the element 2, with successive domains magnetized in opposite directions as indicated by arrows 5A–5D.

Figure 2C:
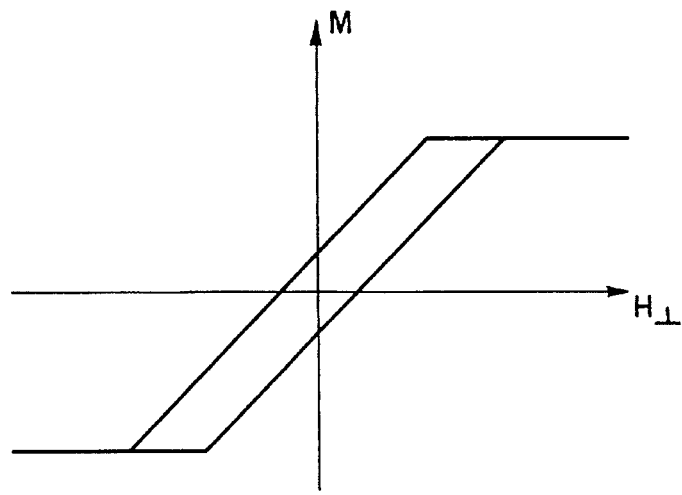
FIG. 2C shows the M-H loop of a transversely annealed magnetostrictive element in a transverse applied field.

FIG. 2C shows a M-H curve of the element 2 after the above processing and with an external A.C. field $H_{ext}$ applied perpendicular to the length of the element 2. The loop is sheared over principally by the dipole field created when the material is magnetized along a short dimension. In this case, magnetization occurs by wall motion so there is some coercivity and the remanence $B_r$ is small but not necessarily zero.

Figure 2D:
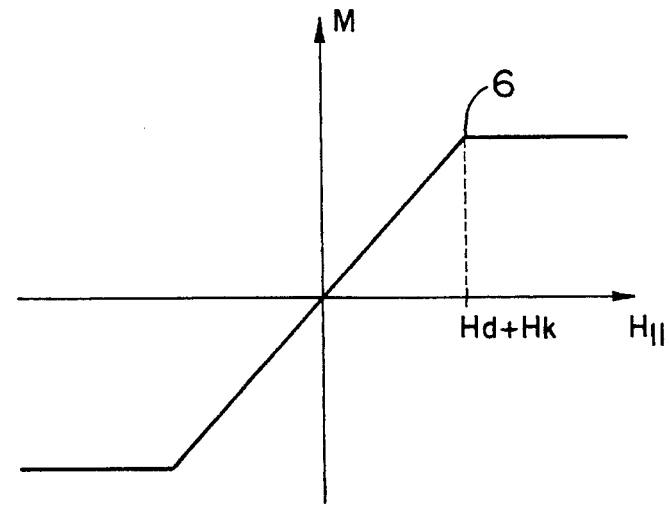
FIG. 2D shows the M-H loop of a transversely annealed magnetostrictive element in a longitudinal applied field including the contributions of the demagnetization field Ha and anisotropy field $H_k$.

FIG. 2D shows a M-H curve of the element 2 after the above transverse anneal processing and with an external A.C. field applied to the element 2 parallel to its length. In known magnetomechanical markers, an external D.C. bias field equal to $H_k+H_d$ is applied to the element 2 along its length to allow the element to operate near the knee 6 of the M-H curve. $H_d$ is the demagnetization field and $H_k$ is the field required to overcome the transverse anisotropy so that the domain magnetizations are oriented in the longitudinal direction of the element 2.

Figure 3:
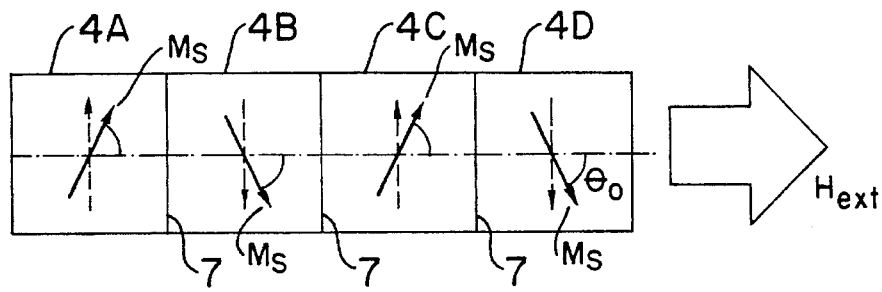
FIG. 3 illustrates, in simplified form, the magnetic domain structure of a transversely annealed magnetostrictive element in a non-saturating longitudinal field.

FIG. 3 pictorially shows the spontaneously demagnetized element 2 of FIG. 2B subjected to a weak longitudinal D.C. magnetic field $H_\parallel$. The walls 7 have no incentive to move and the domain magnetization $M_s$ rotates into the field $H_\parallel$. The magnitude of the longitudinal domain magnetization is given as $M_\parallel = M_s \cos\theta = M_s \cdot H_\parallel / H_k$, where the transverse anisotropy $H_k = 2K_u/M_s$ requires magnetization by a rotation process and $K_u$ is the anisotropy constant.

Figure 4A:
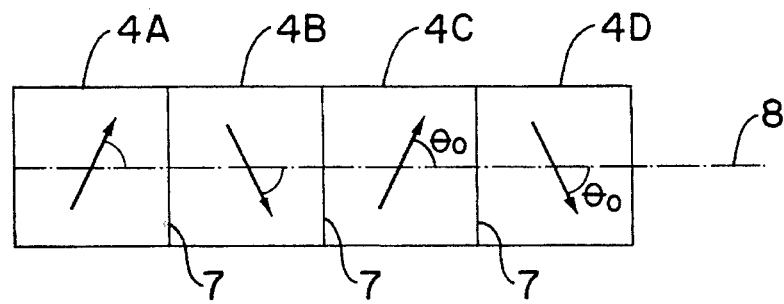
FIG. 4A and FIG. 4B illustrate, in simplified form, two stable domain configurations for the magnetostrictive element longitudinally annealed in the configuration shown in FIG. 3.
Figure 4B:
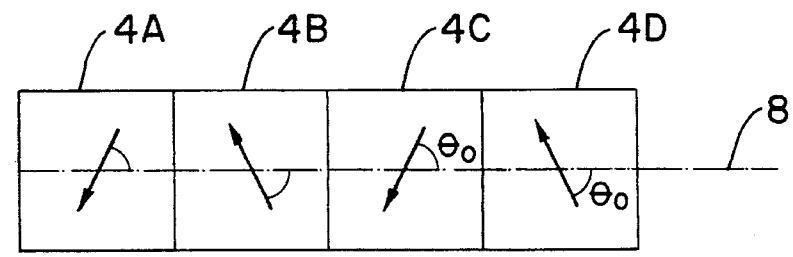

In accordance with the principles of the present invention, and as shown pictorially in FIGS. 4A and 4B, the element 2 is further processed by annealing the element while in the partially magnetized state provided by the longitudinal D.C. magnetic field $H_\parallel$ as shown in FIG. 3. This longitudinal annealing results in the easy direction of magnetization alternating from domain to domain with an angle θ equal to $\pm\theta_o$ relative to the element length or axis 8. Further, the domain walls 7 become stabilized in their positions. FIGS. 4A and FIG. 4B show the two possible stable configurations when the longitudinally annealed element 2 is subsequently subject to a zero field $H_{ext}=0$, respectively. In neither case is the remanence zero; the material retains a bias along its length.

When a domain configuration like that in FIG. 4A is to be annealed—in, care must be taken to account for the variations in $M_s$ and $K_u$ as T increases to the annealing temperature. For a transversely annealed sample, M(H) is initially given by $M_sH/H_k$. To achieve a specific component of $M_s$ along the element 2 axis upon cooling to room temperature after the second anneal, $M/M_s$ can be expressed as $M/M_s = \cos\theta_o = H_{anneal}/H_k(T_a) = H/H_k$ at room temperature (RT). However, since $H_k(T_a) \neq H_k(RT)$, then $H_{anneal} \neq H$ at room temperature (RT). The transverse anisotropy can, with reasonable accuracy, be described as being quadratic in the magnetization because of its likely origin in pair ordering.

$$\frac{K(T)}{K(0)} = \frac{H_k(T)M_s(T)}{H_k(0)M_s(0)} = [M_s(T)/M_s(0)]^2$$

Figure 6:
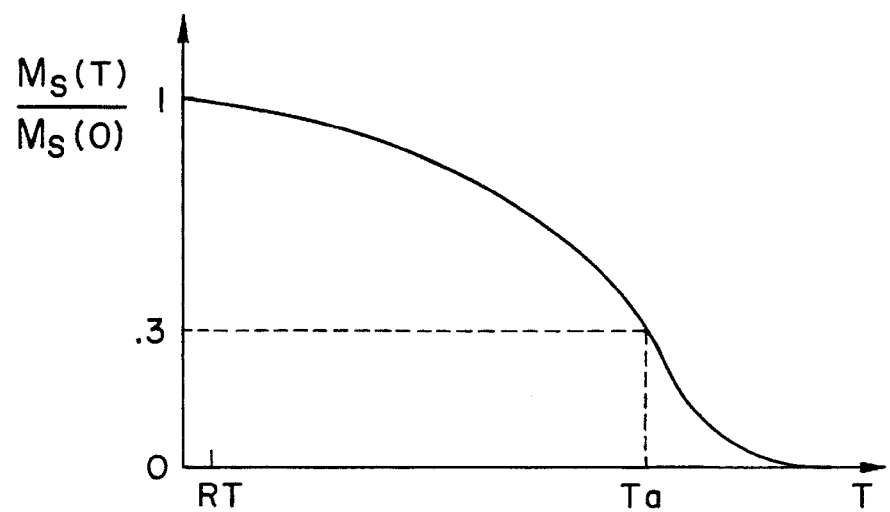
FIG. 6 is a graph illustrating the temperature dependence of magnetization as used in determining the appropriate field for longitudinal annealing.

The annealing field $H_{anneal}$ can, therefore, be selected by $H_{anneal} = H_k(T_a) \cdot \cos\theta_o = \cos\theta_o [M_s(T_a)/M_s(0)]H_k(0)$ where T=0 is defined as room temperature. For example, if $H_k(0)=5$ Oe and Ms(T) varies as shown in FIG. 6, $[M_s(T_a)/M_s(0)]= 0.3$ at $T_a=300°$ C., so that an annealing field of 1.5 cos $\theta_o$ (Oe) will produce the desired domain magnetization orientation upon returning to room temperature.

FIG. 5B shows theoretical M-H loops for the longitudinally annealed element 2, where the demagnetization field Ha has been removed for simplicity, for different values of $\theta_o$.

Figure 4C:
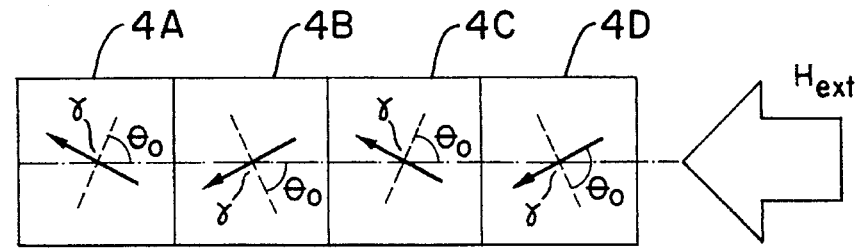
FIG. 4C illustrates, in simplified form, the instability point in magnetization reversal of the magnetostrictive element shown in FIG. 4A.

These curves demonstrate that for various values of $\theta_o$, a non-zero remanence condition, and therefore, a self-biased condition for the element 2 results. Starting with the applied longitudinal A.C. magnetic field $H_\parallel$ at saturation, where $H_\parallel > H_k$, upon decreasing $H_\parallel$ below $H_k$ ($_\parallel < H_k$), the magnetization $M_s$ rotates away (angle θ increases from 0°) from the longitudinal direction of the applied field $H_\parallel$. At $H_\parallel=0$ it assumes the angle $\theta_o$ shown in FIG. 4A. As $H_\parallel$ goes negative, the magnetization continues to rotate increasing the angle θ until, as shown in FIG. 4C, at some value of the angle θ near $\theta_o+\gamma$, the magnetization becomes unstable and flips discontinuously to a configuration close to that shown in FIG. 4B. At this point, there is a discontinuous change in magnetization direction and generally also in $M_s \cos\theta$ (see the curves of FIG. 5B). For values of $\theta_o<45°$, there will be a significant discrete step in magnetization to a negative value at this point.

Figure 8A:
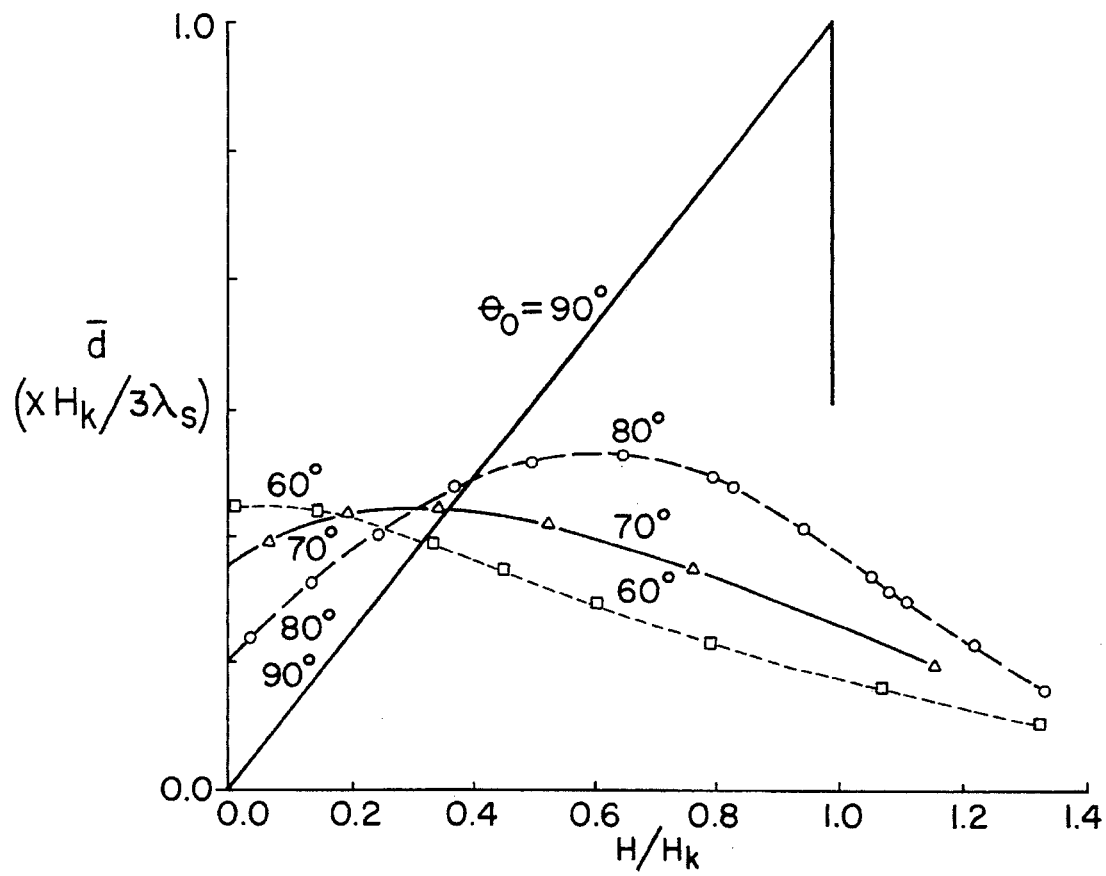
FIG. 8A is a graph illustrating the magnetostrictivity (d) as a function of the bias field for various orientations $\theta_o$ of the uniaxial anisotropy field.

The magnetostrictivity d for a magnetostrictive element having a canted anisotropy or easy axis can be readily calculated by extending the simple linear model that applies for an element whose anisotropy is at $\theta_o=90°$. Curves for the parameter d based on theoretical calculations are shown in FIG. 8A for various orientations of the easy axis or anisotropy relative to the longitudinal axis of the magnetostrictive element. Shown by the solid line is the curve for d for $\theta_o=90°$, for which $d=3\lambda_s H/H_k^2$. Further shown is the curve for d for $\theta_o=80°$, $\theta_o=70°$, $\theta_o=60°$. These curves are all shown as a function of normalized externally applied bias field $H/H_k$. Of importance to the present invention is that the magnetostrictivity d takes on significant value even in the event of a zero applied bias field for different canted anisotropies or easy axes, i.e., values of $\theta_o$.

Figure 8B:
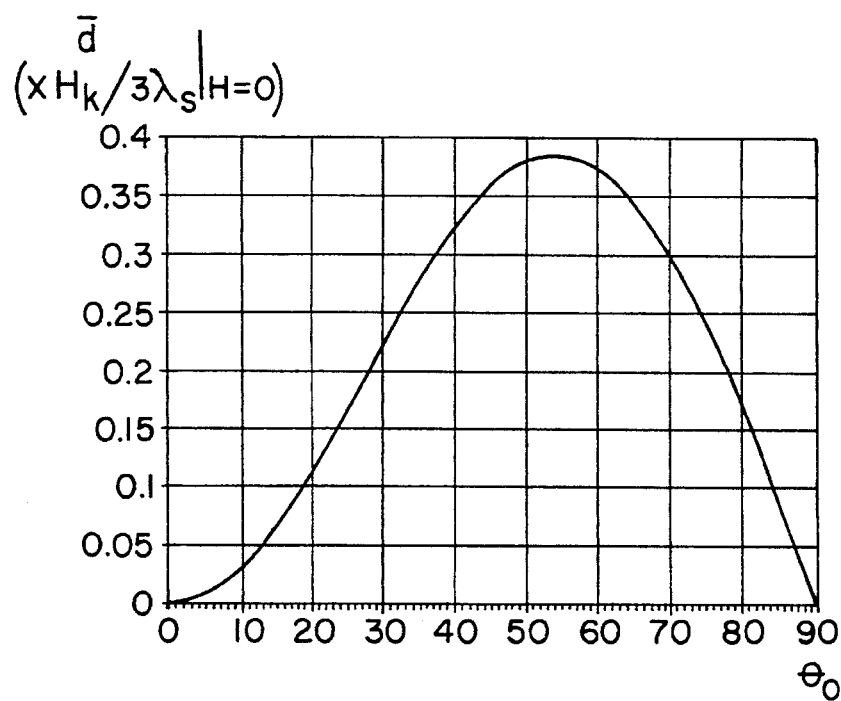
FIG. 8B is a graph illustrating the magnetostrictivity (d) as a function of the orientation $\theta_o$ of the uniaxial anisotropy field for a zero bias field.

FIG. 8B graphs the magnetostrictivity d as a function of the angle $\theta_o$ for the condition where the external bias field is at zero. As can be seen from the graph in FIG. 8B, $\theta_o=55°$ represents near optimal zero-bias coupling due to the magnetostrictivity d being maximized. Accordingly, by processing the magnetostrictive element 2 of the invention so that $\theta_o$ is close to 55°, a maximum magnetostrictivity d for the element can be realized in the absence of an external bias field.

Figure 4D:
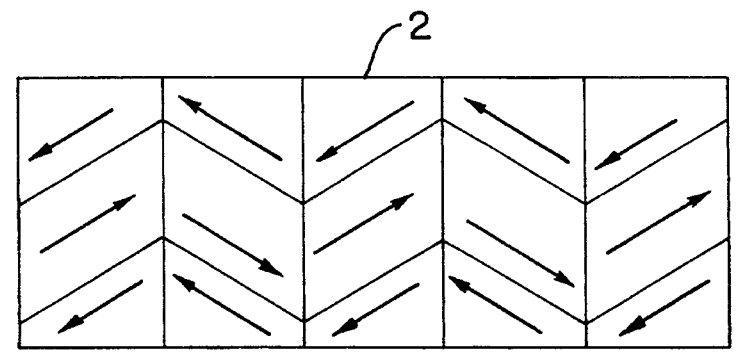
FIG. 4D illustrates, in simplified form, domain configurations resulting from deactivation of the magnetostrictive element.

The magnetostrictive element 2 of the invention can be deactivated by application of a decaying AC magnetic field or by contact with a multipole magnet. After the application of the decaying AC field the domain configuration appears as shown in FIG. 4D. It will be noted from FIG. 4D that the previous domain structure shown in FIG. 4A has been broken up into smaller domains with orientations as indicated by arrows.

For the demagnetized magnetostrictive element shown in FIG. 4D, the net magnetization in the longitudinal axis of the element is zero (M=0). Therefore, when demagnetized, the magnetostrictive element 2 exhibits minimal magnetomechanical coupling. In this state, wall movement as opposed to pure rotation dominates the magnetic response, limiting any magnetomechanical coupling to negligible values.

The magnetostrictive element 2 can be reactivated by a brief application of a saturating DC field $H>2H_c$ in a longitudinal direction of the element After the application of the DC field $H>2H_c$, the domain structure of the magnetostrictive element 2 returns to that shown in FIG. 4A, restoring the canted magnetization at $\theta_o$ greater than zero (as discussed above, preferably at 55° for maximum magnetomechanical coupling). The element 2 will thus again exhibit a measurable magnetomechanical response, without requiring a separate bias element.

Figure 9A:
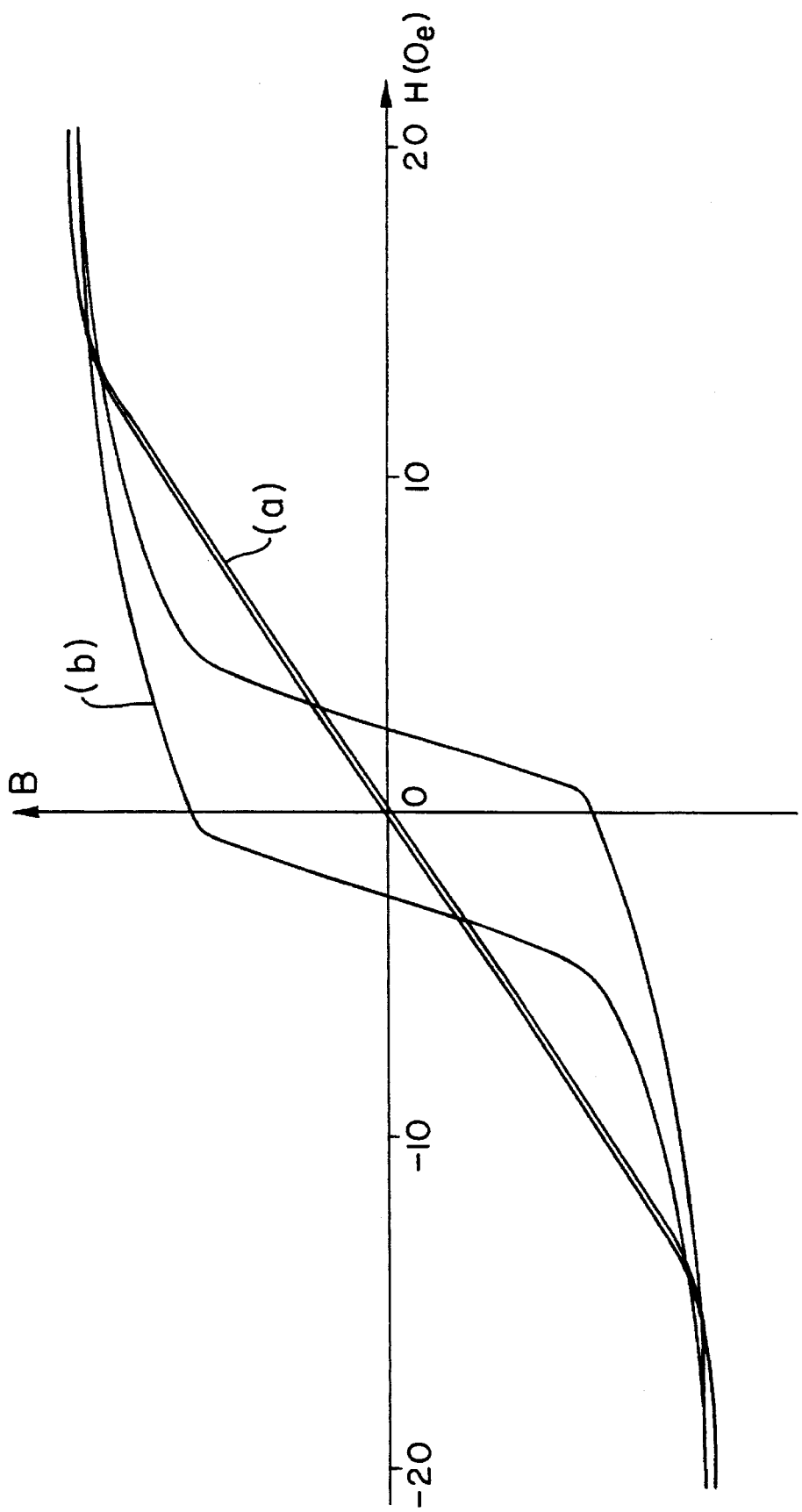
FIGS. 9A and 9B respectively show B-H loops of a ribbon of Fe—Co alloy subjected to annealing in accordance with the invention.
Figure 9B:
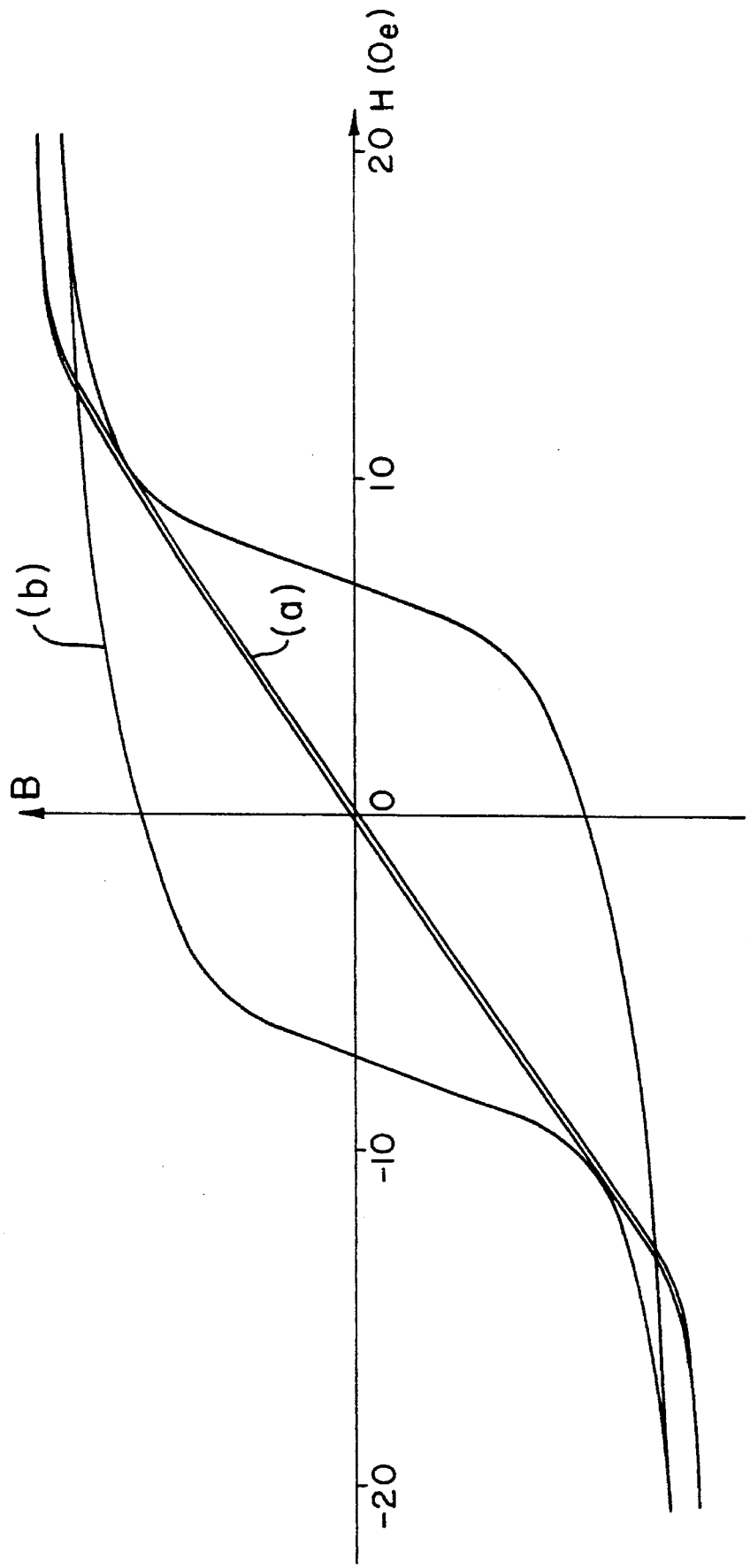

A magnetostrictive element 2 was fabricated by performing the two-step annealing process of the invention on an amorphous alloy strip having the composition $(Fe_{0.4}Co_{0.6})_{79}Si_2B_{19}$. The resulting B-H loops are shown in FIGS. 9A and 9B. In both examples, the first anneal was carried out for 10 minutes at 380° C. with a saturating transverse field. In the example of FIG. 9A, the second, longitudinal anneal was for 30 mins. at 438°–439° C. with a longitudinal field of 1 Oe. In the example of FIG. 9B, the second anneal was for 30 mins. at 440°–443° C., again with a longitudinal field of 1 Oe.

In both of the FIGS. 9A and 9B curve (a) represents the B-H characteristic of the material in a longitudinal field after the first anneal and curve (b) represents the B-H characteristic in a longitudinal field obtained after the second anneal. It will be noted that in the example of FIG. 9B, $H_c$ (the width of the vertical section of the loop) has been increased to about 7 Oe.

It is believed that the two-step annealing process described above increases the coercivity of the amorphous alloy strip, and the increased coercivity, together with the domain configuration (FIG. 4A) produced by the two-step annealing, tends to inhibit domain wall motion upon subsequent exposure to an external field. The domain configuration is also an important factor in the rotation of magnetization, which provides magnetomechanical response when the strip is in a remanent state.

Figure 10:
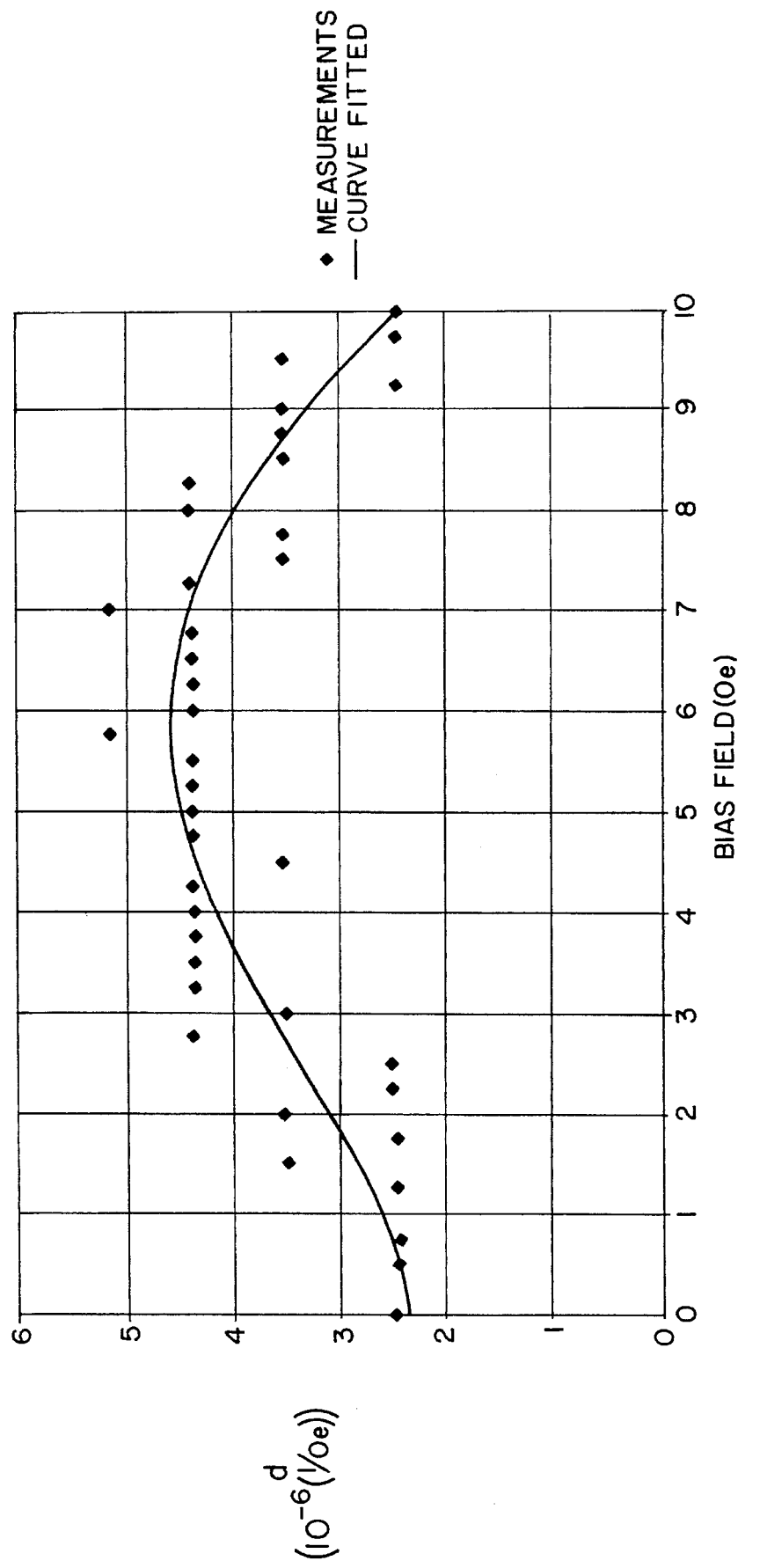
FIG. 10 shows the bias field dependence of magnetostrictivity (d) for the Fe—Co alloy ribbon after annealing in accordance with the invention.

FIG. 10 shows actual measurements and a fitted curve for magnetostrictivity vs. bias field for the material of FIG. 9A annealed first in a transverse field then in a longitudinal field. This curve can be compared with the theoretical curves of FIG. 8A calculated for various orientations $\theta_o$ of the easy axis. The measured magnetostrictivity at H=0 in FIG. 10 is a significant fraction of the peak magnetostrictivity. In fact, this particular sample corresponds to an average induced anisotropy along an axis oriented between 70° and 80° from the ribbon axis (See FIG. 8A).

Figure 11:
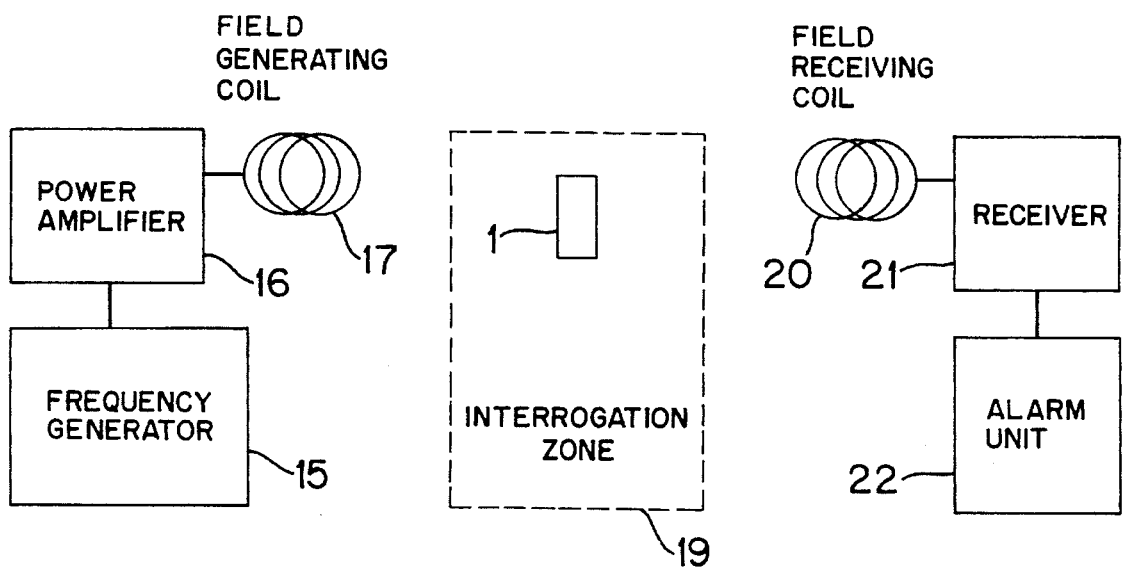
FIG. 11 schematically illustrates an electronic article surveillance system with which the marker of FIG. 1 is used.

FIG. 11 illustrates the use of a marker within an article surveillance system 14. The article surveillance system forms an interrogation zone 19 near an exit area, in which the presence of an active marker 1 will be detected. The interrogation zone 19 is formed between a field generating coil 17 and a field receiving coil 20. The size and shape of the interrogation zone 19 is dependent upon the size and shape of the field generating coil 17 and the field receiving coil 20, and is further dependent upon the intensity of the magnetic field projected by the field generating coil 17.

A frequency generator 15 provides either a steady frequency waveform, a swept frequency waveform, or a pulsed frequency waveform to a power amplifier 16. The amplifier 16 increases the magnitude of the waveform and in turn drives the field generating coil 17. The field generating coil emits an AC magnetic field of desired frequency and amplitude in the interrogation zone 19. A receiving coil 20 is provided for receiving the AC magnetic field and connects to a receiver 21 which in turn connects to an alarm unit 22.

When the active marker 1 is placed within the interrogation zone 19 and a predetermined detection frequency, corresponding to the marker's resonant frequency, is projected into the interrogation zone 19, the receiver 21 detects an increase in signal amplitude due to the presence of the marker 1 and, therefore, triggers the alarm unit 22. However, if the marker 1 is in a deactivated state, the marker 1 will not increase the magnitude of the signal received at the receiver 21 while the predetermined detection frequency is projected into the interrogation zone 19 and, therefore, the receiver does not trigger the alarm unit 22.

Figure 12:
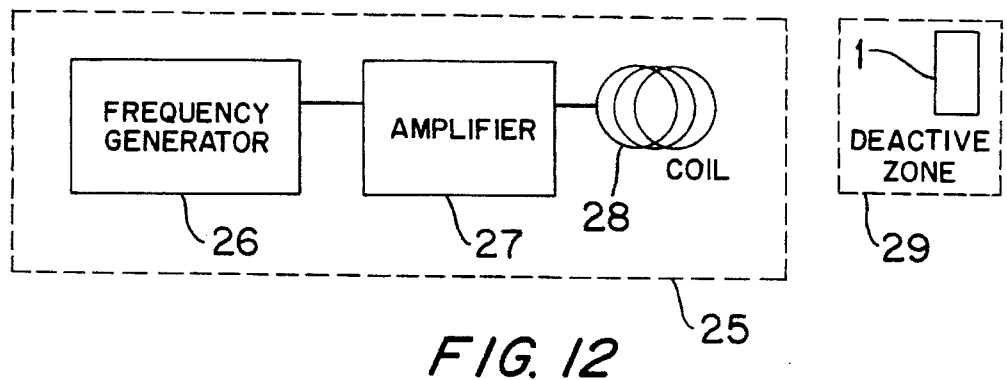
FIG. 12 illustrates a device used for deactivating the marker of FIG. 1.

FIG. 12 illustrates a deactivation unit 25 which comprises a frequency generator 26, for generating an AC waveform, having an output connected to an amplifier 27 arranged to reduce gain as a function of time. The output of the amplifier 27 drives an antenna 28 which projects a magnetic field, which decays in amplitude over time, into a deactivation region 29. A marker 1, placed within the deactivation region 29, has its magnetostrictive material 2 demagnetized and therefore, changes the frequency at which it resonates as previously discussed. The magnitude of the magnetic field required to demagnetize the marker 1 may be as low as $5 \geq 7$ Oe, although it is preferable that a field in the range of 20–40 Oe be required in order to prevent unintended deactivation.

While the marker 1 has been shown in the embodiments herein to have a particular geometry, it should be noted that the marker 1, and the magnetostrictive element 2 contained therein, can take on a variety of shapes. Thus, the magnetostrictive element 2 can be in the form of a ribbon, wire, sheet, film or other configuration.

The two-step annealing process described above is believed to be the preferable technique for obtaining a self-biasing magnetostrictive element. However, it is also within the contemplation of the invention to use a one-step oblique anneal to obtain a self-biased magnetostrictive element having a remanent component in the longitudinal direction.

Figure 13A:
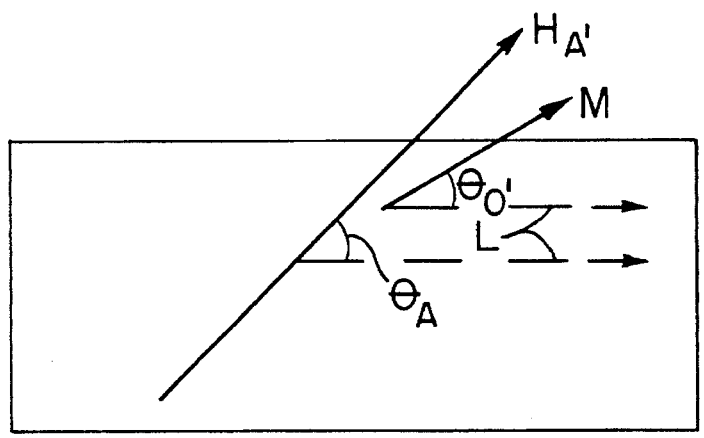
FIGS. 13A–13C illustrate an alternative technique for forming a self-biasing magnetostrictive element according to the invention.
Figure 13B:
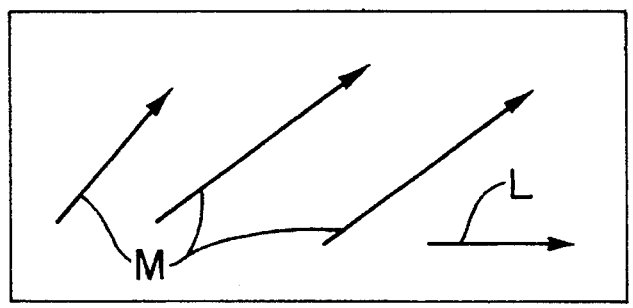
Figure 13C:
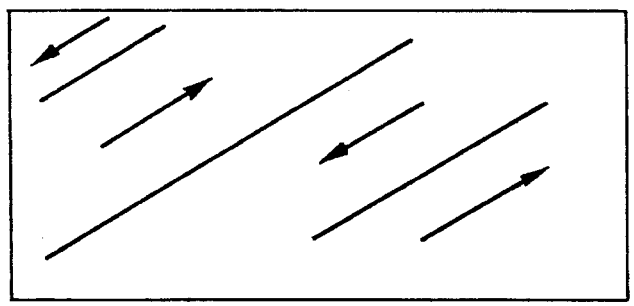

FIGS. 13A–13C will be referred to in explaining how a one-step oblique anneal is carried out. As shown in FIG. 13A, an oblique anneal may be performed by heating a strip of magnetostrictive material in the presence of a magnetic field oriented at an angle $\theta_A$ to the longitudinal direction L of the strip ($0°<\theta_A<90°$). The anneal is performed so as to provide a direction of magnetization M at an angle $\theta_{o'}$ from the direction L ($0°<\theta<90°$; $\theta_o$ may be=$\theta_A$). The objective of the oblique anneal is to produce a substantially single-domain remanent state (shown in FIG. 13B), produced without wall motion, and with a direction of magnetization M canted at an oblique angle from the longitudinal direction L. It will be noted that the remanent magnetization shown in FIG. 13B has a component in the longitudinal direction. On the other hand, it is not satisfactory if the oblique anneal results in multiple domains, with alternating orientations, caused by wall motion (shown in FIG. 13C). In the domain pattern of FIG. 13C, there is no net remanent component in the longitudinal direction.

The oblique single-domain remanent magnetization illustrated in FIG. 13B is suitable for providing a self-biased magnetostrictive element but is less favorable than the remanent states shown in FIGS. 4A and 4B because the condition of FIG. 13B has a large magnetostatic energy.

As another alternative to the two-step annealing technique described above with reference to FIGS. 2–4, it is also contemplated to form by casting an amorphous or crystalline magnetostrictive element having a domain structure like that shown in FIG. 2B. Then a longitudinal anneal is performed to obtain the canted orientations yielding a longitudinal remanence as in FIG. 4A.

In all cases it is understood that the above-described arrangements are merely illustrative of the many possible specific embodiments which represent applications of the present invention. Numerous and varied other arrangements can be readily devised in accordance with the principles of the present invention without departing from the spirit and scope of the invention.

What is claimed is:

1. A marker for use in an electronic article surveillance system comprising:

a strip of magnetically soft magnetostrictive material having length and width extent and having a plurality of magnetic domains, a sufficient number of said domains having respective magnetic easy axes at a non-zero angle to said length, and said domains being magnetized, such that in the absence of an externally applied magnetic field there is a resultant magnetization in said material along said length.

2. A marker in accordance with claim 1 wherein:
the magnetization of each of said domains is at an angle with respect to said length.

3. A marker in accordance with claim 2 wherein:
said angle is at +θ and −θ for successive domains along said length.

4. A method of fabricating a marker for use in an electronic article surveillance system comprising the steps of:
first annealing a strip of magnetostrictive material having length and width extent during application of a first magnetic field directed transverse to said length; and
subsequent to said first annealing, second annealing said strip during application of a second magnetic field directed along said length to create in said material a plurality of magnetic domains extending from edge to edge across said width of said strip and magnetized such that there is a resultant magnetization in said material along said length.

5. A method in accordance with claim 4 wherein said second annealing is performed so that the magnetization of each of said domains is at an angle $\theta_o$ ($0°<\theta_o<90°$) with respect to said length.

6. A method in accordance with claim 5 wherein said second annealing is performed so that said angle is at $+\theta_o$ and $-\theta_o$ for successive domains along said length.

7. A method for fabricating a marker for use in an electronic article surveillance system comprising the steps of:
forming a strip of magnetomechanical material having length and width extent and having a plurality of magnetic domains of alternating polarity oriented transversely to said length of said strip, and
annealing said strip during application of a magnetic field directed along said longitudinal axis to reorient said domains such that there is a resultant magnetization $M_{\parallel}$ in said material along said length ($0<M_{\parallel}<M_s$, where Ms is a domain magnetization).

8. A method in accordance with claim 7 wherein said annealing is performed so that a direction of magnetization of each of said domains is deflected by an angle $\pm\theta_o$ ($0°<|\theta_o|<90°$) from a direction of said resultant magnetization, successive ones of said domains being deflected at $+\theta_o$ and $-\theta_o$.

9. A method in accordance with claim 7 wherein said forming step includes casting a magnetic material to form an amorphous strip having said magnetic domains of alternating polarity.

10. A method in accordance with claim 7, wherein said forming step includes casting a magnetic material to form a crystalline strip having said magnetic domains of alternating polarity.

11. A marker for use in an electronic article surveillance system comprising:
a strip of magnetostrictive material having a longitudinal axis and a single magnetic domain having a remanent magnetization oriented at an angle of more than 0° and less than 90° from said longitudinal axis.

12. A method of fabricating a marker for use in an electronic article surveillance system comprising the steps of:
providing a strip of magnetostrictive material having a longitudinal axis; and
annealing said strip during application of a magnetic field directed at a first angle of more than 0° and less than 90° from said longitudinal axis to create in said strip a single-domain remanent magnetization canted at a second angle of more than 0° and less than 90° from said longitudinal axis.

13. A method in accordance with claim 12 wherein said second angle is equal to said first angle.

14. A marker for use in an electronic surveillance system comprising:
a strip of magnetostrictive material having length and width extent and a magnetization which in the absence of an externally applied field exhibits a component along said length of said material and which in the presence of an applied field undergoes substantial magnetization rotation and limited wall motion so as to exhibit sufficient magnetomechanical coupling to provide a discernible output signal.

15. A magnetomechanical electronic article surveillance system comprising:
(a) generating means for generating an electromagnetic field alternating at a selected frequency in an interrogation zone, said generating means including an interrogation coil;
(b) a marker secured to an article appointed for passage through said interrogation zone, said marker including a strip of magnetostrictive material having length and width extent and having a plurality of magnetic domains situated along said length and magnetized such that in the absence of an externally applied field there is a resultant magnetization in said material along said length, and said strip being mechanically resonant when exposed to said alternating field at said selected frequency; and
(c) detecting means for detecting said mechanical resonance of said strip of magnetostrictive material.

16. A magnetomechanical electronic article surveillance system according to claim 15, wherein:
the magnetization of each of said domains of said strip is at an angle with respect to said length of said strip.

17. A magnetomechanical electronic article surveillance system according to claim 16, wherein:
said angle is at +θ and −θ for successive domains along said length.

18. A magnetomechanical electronic article surveillance system according to claim 15, wherein said generating means operates to generate said alternating field at said selected frequency in a pulsed fashion and said strip of magnetostrictive material produces mechanical perturbations that are detectable by said detecting means during a period of time after the alternating field at said selected frequency has stopped.

19. A magnetomechanical electronic article surveillance system comprising:
(a) generating means for generating an electromagnetic field alternating at a selected frequency in an interrogation zone, said generating means including an interrogation coil;
(b) a marker secured to an article appointed for passage through said interrogation zone, said marker including a strip of magnetostrictive material having length and width extent and having a magnetization which in the absence of an externally applied field exhibits a component along said length of said material and which in the presence of said alternating electromagnetic field undergoes substantial magnetization rotation and limited wall motion so as to exhibit sufficient magnetomechanical coupling to provide a discernable output signal; and (c) detecting means for detecting said output signal of said marker.

20. A magnetomechanical electronic article surveillance system according to claim 19, wherein said generating means operates to generate said alternating field at said selected frequency in a pulsed fashion and said strip of magnetostrictive material produces magnetic field perturbations that are detectable by said detecting means during a period of time after the alternating field at said selected frequency has stopped.

* * * * *

UNITED STATES PATENT AND TRADEMARK OFFICE
CERTIFICATE OF CORRECTION

PATENT NO. : 5,565,849

DATED : October 15, 1996

INVENTOR(S) :
    Wing Ho, et al.

It is certified that error appears in the above-indentified patent and that said Letters Patent is hereby corrected as shown below:

Col. 3, line 1, change "Ha" to -- $H_d$ --.

Col. 4, line 12, change "$b\lambda_s H/H^2_A$" to -- $3\lambda_s H/H^2_A$ --.

Col. 5, line 64, change "Ha" to -- $H_d$ --.

Col. 6, line 3, change "$H_\parallel$ below $H_k$ ($_\parallel < H_k$)" to -- $H_\parallel$ below $H_k$ ($H_\parallel < H_k$) --.

Col. 9, line 44, change "Ms" to -- $M_s$ --.

Signed and Sealed this

Twenty-seventh Day of May, 1997

Attest:

BRUCE LEHMAN

*Attesting Officer*   Commissioner of Patents and Trademarks